(12) United States Patent
Frijlink et al.

(10) Patent No.: US 6,248,666 B1
(45) Date of Patent: Jun. 19, 2001

(54) PROCESS OF MANUFACTURING A SEMICONDUCTOR DEVICE INCLUDING A BURIED CHANNEL FIELD EFFECT TRANSISTOR

(75) Inventors: Peter Frijlink, Yerres; Jean-Luc Oszustowicz, Brie-Comte-Robert, both of (FR)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/241,017

(22) Filed: Feb. 1, 1999

(30) Foreign Application Priority Data

Feb. 9, 1998 (EP) .................................. 98400289

(51) Int. Cl.$^7$ .................................................. H01L 21/302
(52) U.S. Cl. .......................... 438/689; 438/735; 438/737; 438/738
(58) Field of Search .................................. 438/689, 735, 438/737, 738

(56) References Cited

U.S. PATENT DOCUMENTS

| | | | |
|---|---|---|---|
| 4,984,036 | * 1/1991 | Sakamoto et al. | 357/22 |
| 5,270,228 | 12/1993 | Ishikawa | 437/39 |
| 5,364,816 | 11/1994 | Boos et al. | 437/133 |
| 5,534,452 | 7/1996 | Nakanishi et al. | 437/40 R |

* cited by examiner

Primary Examiner—Benjamin L. Utech
Assistant Examiner—Vanessa Perez-Ramos
(74) Attorney, Agent, or Firm—Norman N. Spain (57) ABSTRACT

A process of manufacturing a semiconductor device with a double-recessed gate field effect transistor, comprising the formation, on a substrate (1), of an active layer (3) of a semiconductor material and a first dielectric layer ($D_1$), and further comprising the steps of:

forming a second dielectric layer (R), forming an aperture ($A_0$) in the second dielectric layer (R), then a first opening ($A_1$) in the first dielectric layer ($D_1$) having a same first width, while forming a second opening ($A_2$) in the second dielectric layer having a second width larger than the first width, and then etching a preliminary recess ($A_4$) in the subjacent semiconductor layer through said first opening ($A_1$) having said first width, enlarging said first opening ($A_1$) in the first dielectric layer ($D_1$) to form a third opening ($A_3$) having a third width larger than the second width, and then etching the semiconductor layer through said preliminary recess ($A_4$) to form a deeper central recess ($A_6$) having substantially said first width while etching a shallower peripheral recess ($A_5$) substantially having said third width through said third opening ($A_3$), and depositing through said second opening ($A_2$) a gate metal material (8) having substantially said second width and extending over said central deeper recess ($A_6$) and partially over said peripheral shallower recess ($A_5$).

10 Claims, 5 Drawing Sheets

PROCESS OF MANUFACTURING A SEMICONDUCTOR DEVICE INCLUDING A BURIED CHANNEL FIELD EFFECT TRANSISTOR

FIELD OF THE INVENTION

The invention relates to a process of manufacturing a semiconductor device including a buried channel field effect transistor, said processor comprising, for realizing the field effect transistor, the steps of forming a stacked arrangement of layers on a substrate including an active layer, forming a recess in said active layer, referred to as gate recess, constituting a channel between source and drain electrodes, and forming a gate electrode which is in contact with the active layer in said gate recess.

The invention is used for example in the manufacture of microwave frequency circuits which are monolithically integrated in the III–V semiconductor material technology (MMICs).

BACKGROUND OF THE INVENTION

A field effect transistor with buried channel is known from U.S. Pat. No. 4,984,036. This transistor comprises an active layer formed on a substrate and a buried channel constituted by recesses arranged at three levels in the active layer. Each buried channel recess in this transistor is formed so as to be narrower and deeper at each subsequent level as the channel approaches the substrate. This transistor also comprises a gate electrode which is arranged so as to be in contact with the active layer in the central recess of the channel closest to the substrate.

This gate electrode is formed so as to be than the central recess of the channel in which it is provided. The field effect transistor thus formed may have a high electron mobility in that the active layer is constituted by two layers of material having different electron affinity so that they form a heterojunction. The field effect transistor may be realized in a Ill–V semiconductor material system with a substrate made of GaAs.

The process of manufacturing the known transistor comprises the steps of forming the active layer on a substrate, forming the recesses for the buried channel at different levels, and depositing the gate metallization in the narrowest, deepest recess.

The steps for forming the recesses comprise: depositing a protective layer of dielectric material (SiN or $SiO_2$), depositing a photoresist layer, providing an opening in the photoresist layer having a width which is exactly equal to that of the future gate metallization of the transistor, selectively etching the subjacent protective layer and the active layer to form second and third openings having widths equal to the opening in the photoresist, enlarging the second opening in the protective layer by selective etching, by under-etching said protective layer with respect to the photoresist opening, and selectively etching the active layer, resulting in under-etching the active layer with respect to the protective layer and a narrower and deeper central recess.

At this stage of the known process, the transistor presents a two-stage gate recess. According to this known process, the resulting transistor comprises a greater number of recesses which one formed by repeating the last two steps. The next process step comprises the deposition of the gate metallization through the photoresist opening, which is still the same as at the beginning of the process, thus providing a gate electrode contact which is narrower than the deepest recess.

This process finally comprises the steps of realizing source and drain electrodes by providing a last protecting layer covering the recesses and the gate electrode, forming openings in said last protecting layer and depositing the source and drain metallizations in said openings of the last protecting layer.

Said multi-step etching process to which the active layer is subjected gradually increases the recess width of the deepest part of said recess. But due to selective etching, the width of the first opening in the resist is never enlarged. Thus, finally the width of the deepest part of the recess formed by said multiple etching process exceeds the width of the photoresist aperture. This is the reason why the gate electrode contact, which has the same width as the photoresist aperture, is narrower than the deepest recess.

The technical problem resolved by this known transistor results in any improvement of the breakdown voltage without an increase in gate-source resistance.

Several field effect transistor types are currently being used, among them transistors which are normally conducting (N-ON) when the gate is at the same potential as the source and which are pinched off through depletion when the potential of the gate is more negative than that of the source, and transistors which are normally pinched off (N-OFF) when the gate is at the same potential as the source and which are rendered conducting by enhancement when the potential of the gate becomes more positive than that of the source.

In the depletion-type and enhancement-type field effect transistors, the active layer below the gate electrode has a given thickness, more particularly a thickness which is smaller in the enhancement-type transistor than in the depletion-type transistor. It is often advantageous to realize amplifier transistors by means of enhancement-type transistors, while the charges are realized in active form by depletion-type transistors in integrated semiconductor devices made from III–V materials, such as GaAs compounds in a favorable case.

In vacuum or air, for example, the doped GaAs material of the active layer normally has a surface tension which is determined by the Fermi-level—the surface states being situated in the center of the forbidden band—which is of the order of –0.5 V. As a result, the active layer is normally depleted on either side of the gate contact, in the so-called access zones, which are, accordingly, non-conducting in the normal state.

In the depletion-type transistor, this surface effect is less unfavorable only if the active layer is comparatively thick below the gate, which allows the transistor to be normally conducting up to the moment when of a negative gate voltage application depletes the active layer also below the gate itself, rendering the transistor completely non-conducting.

In the enhancement-type transistor (N-OFF), where the active layer below the gate is thinner, this surface effect is always very unfavorable because the depleted access regions occupy non-negligible portions of the active layer with respect to the thickness on either side of the gate. These depleted access regions are not rendered conducting by the application of a positive gate voltage with respect to the source, so that the active layer is increased practically only below the gate, and accordingly the number of electrons generated is lower than expected. In addition, the saturation velocity is reduced. Accordingly, the saturation current, which depends on the number of generated electrons and on the saturation velocity, is reduced thereby.

A solution to the problem posed by these depleted access regions, especially in the case of enhancement-type transistors (N-OFF), is achieved by embodying these transistors so as to have very narrow access regions, for example of the order of magnitude of the channel width. This solution is not of practical use in the industry. In fact, the realization of transistors having extremely small access regions requires the implementation of specific techniques, which are very costly, difficult to carry out, and thus only suitable for small batches of manufactured circuits, i.e unfavorable for industrial development.

SUMMARY OF THE INVENTION

The present invention has for its object to provide a semiconductor device with a high-performance field effect transistor which has an improved saturation current by using a manufacturing process which employs very simple techniques, thus enabling this semiconductor device to be produced in large quantities and at low cost.

In the transistor fabricated using the process according to the invention, a double recess channel is provided consisting of one central deeper recess and one peripheral shallower recess, the gate electrode extending over the entire deepest recess and over a part of the shallower peripheral recess.

According to the invention, a process of manufacturing a semiconductor device including a field effect transistor having a double-recessed gate with a central recess at a deeper level, a peripheral recess and a gate electrode deposited the entire central recess and extending continuously so as to cover a portion of the peripheral recess comprises the following steps:

a) forming a stack of layers on a substrate comprising an active layer of a semiconductor material and a first dielectric layer, b) covering the first dielectric layer with a second dielectric layer having different etching properties, forming an aperture in the second dielectric layer, forming a first opening in the first dielectric layer having a first width the same as the first aperture, while enlarging the first aperture in the second dielectric layer to form a second opening having a second width, and then etching a preliminary recess in the subjacent layer of semiconductor material delimited by the first opening having the first width, c) enlarging the first opening in the first dielectric layer to form a third opening having a third width larger than the second width of the second opening of the second dielectric layer, and then etching the second semiconductor layer through the preliminary recess to form a deeper central recess having substantially the first width while etching the first semiconductor layer to form a shallower peripheral recess having a width substantially that of the third opening of the first dielectric layer, and d) depositing gate metal material onto the central deeper recess, which material extends over the peripheral recess substantially according to the second width delimited by the second opening of the second dielectric layer.

Preferably, the shallower peripheral recess is not realized in the active layer but in a capping layer covering the active layer.

This manufacturing process enables a field effect transistor to be obtained having an increased saturation voltage, and allows either a completely positive threshold voltage to be obtained of the order of +0.2 or +0.3 V so as to realize an enhancement-type transistor, or a negative threshold voltage so as to realize a depletion-type transistor.

BRIEF DESCRIPTION OF THE DRAWINGS

In the drawing:

FIGS. 1A, 1B and 1C show cross-sectional views of two field effect transistors.

DESCRIPTION OF THE PREFERRED EMBODIMENTS

Figure 1A:
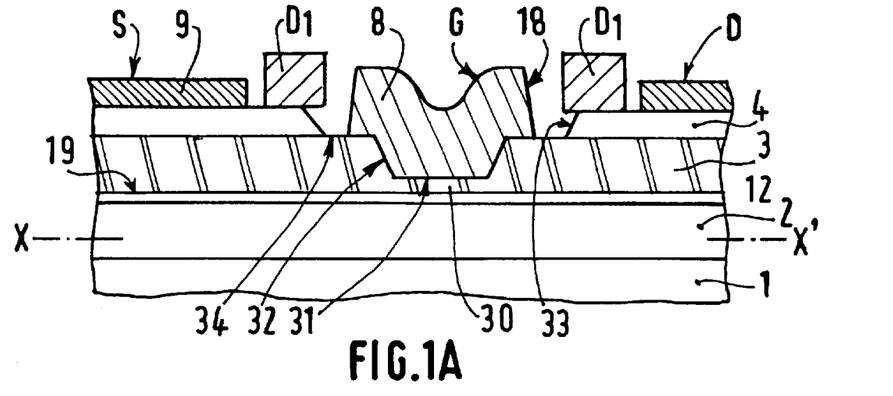

The invention relates to the manufacture of semiconductor devices such as a Monolithic Microwave Integrated Circuit (MMIC). This semiconductor device includes, as shown in FIG. 1A and in FIG. 1B, a field effect transistor which comprises, stacked on a semiconductor substrate 1, at least a semiconductor active layer 3. In a preferred embodiment, the active layer 3 is covered with a semiconductor capping layer 4 of lower resistivity. The field effect transistor also comprises, on the semiconductor layers, a source electrode S and a drain electrode D between which a channel is realized by means of a double-level recess. This double-level recess comprises a deeper and narrower central recess 31, 32 and a shallower and larger peripheral recess 33, 34. This transistor further comprises a gate electrode G which is in contact with the active layer 3 throughout this central recess 31, 32 and which continuously extends beyond this central recess 31, 32 and over a part of the peripheral recess 33, 34 owing to the fact that the transverse dimension referred to as the length of the gate electrode G, is greater than the total transverse dimension, referred to as the width of the central recess 31, 32, and smaller than the total transverse dimension, referred to as the width of the peripheral recess 32, 34. The transverse dimensions are measured along the axis A-A' of the figures.

Figure 1B:
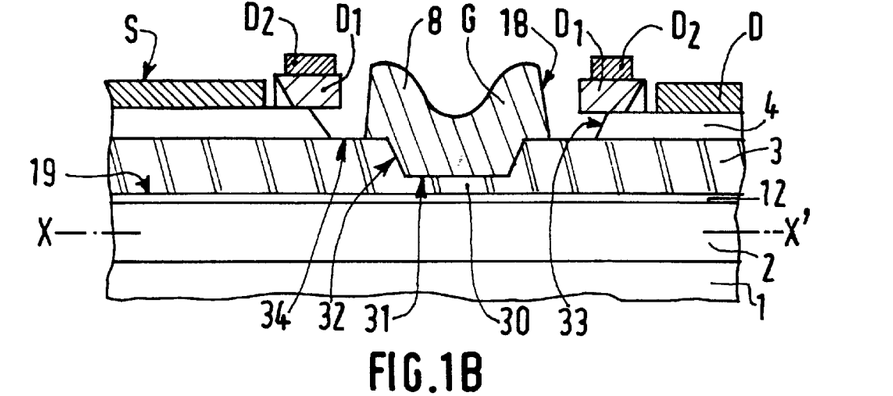

In FIGS. 1A and 1B, the transistor is of the high electron mobility type (HEMT) and comprises, in the stacked arrangement for forming the active layer on the substrate 1, at least two layers having different electron affinities so as to form a heterojunction comprising a lower active layer 12 made of a first material having a first forbidden bandwidth and an upper active layer 3 made of a second material having a greater forbidden bandwidth and forming a heterostructure with the first layer 12, and interface 19 therebetween.

In FIGS. 1A and 1B, for forming the structure of the HEMT, advantageously a heavily $n^{++}$ doped capping layer 4 is present. This capping layer serves to reduce the source and drain resistance of the transistor by increasing the conduction of the semiconductor material in the regions situated below the ohmic source and drain contacts S, D, and to form a spatial separation between the channel region and the regions lying below the ohmic source and drain contacts S, D, which are mechanically and electrically disturbed during fusion of the material 9 for providing said ohmic contacts S and D owing to the fact that the material 9 is a eutectic material for forming a metal-semiconductor alloy. The peripheral shallower recess 33, 34 is realized in the capping layer 4.

The HEMT structure also comprises a metal pad 8 for the gate G which is deposited directly on the material of the upper active layer 3 so as to form a Schottky barrier which is present at a very exact distance 30 from the bottom of the active layer 3, i.e. from the interface 19 of the hetero-structure. This distance 30 represents the effective thickness of the upper active layer 3 and governs the operation of the transistor, i.e. its pinch-off voltage, whereby an enhancement-type or a depletion-type transistor is formed.

By way of example, an enhancement field effect transistor has a distance between the gate contact G and the interface 19 of the hetero-structure of the order of 20 nm, which distance is obtained by means of the channel recess in the upper active layer 3, which is of the order of 50 nm. This transistor operates at a gate-source voltage in the range between +200 mV and +700 mV, with a pinch-off voltage of the order of +350 mV.

This field effect transistor shows not only an improved saturation voltage, but also an increased breakdown voltage as well as low access resistances. The breakdown voltage value depends on the distance separating the edge 18 of the gate metallization 8 from the edge 33 of the peripheral recess 33, 34. In the transistors described above, the portion 30 of the active layer 3 lying below the central deeper recess is preferably not intentionally doped.

Figure 2A:
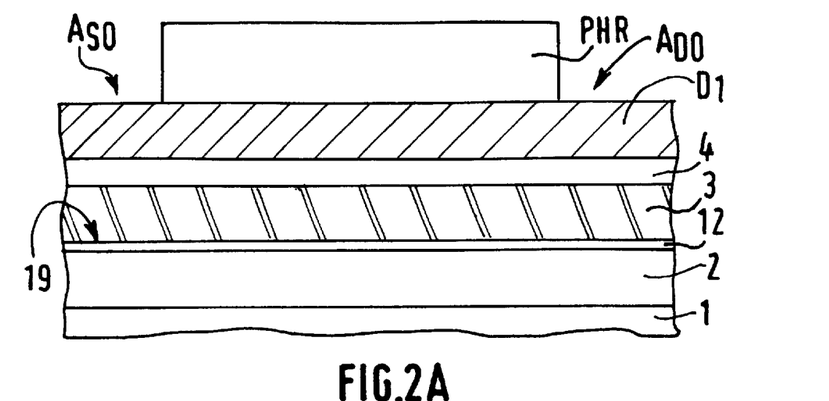
FIGS. 2A to 2K illustrate the steps in the manufacture of the field effect transistor of FIG. 1A.
Figure 2B:
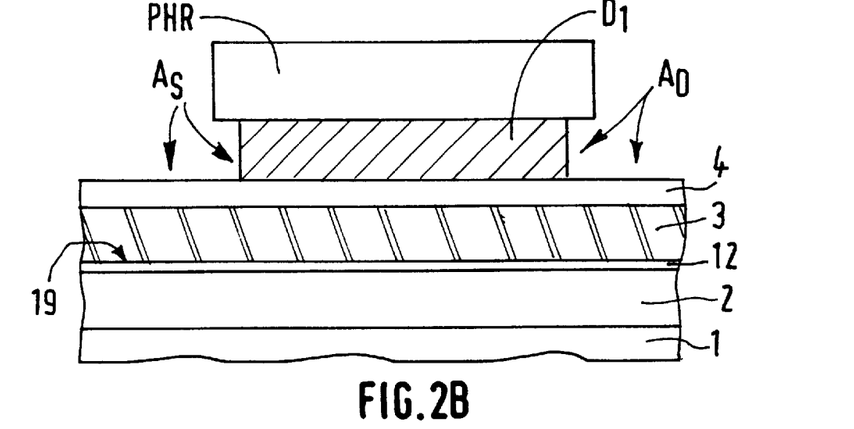
Figure 2C:
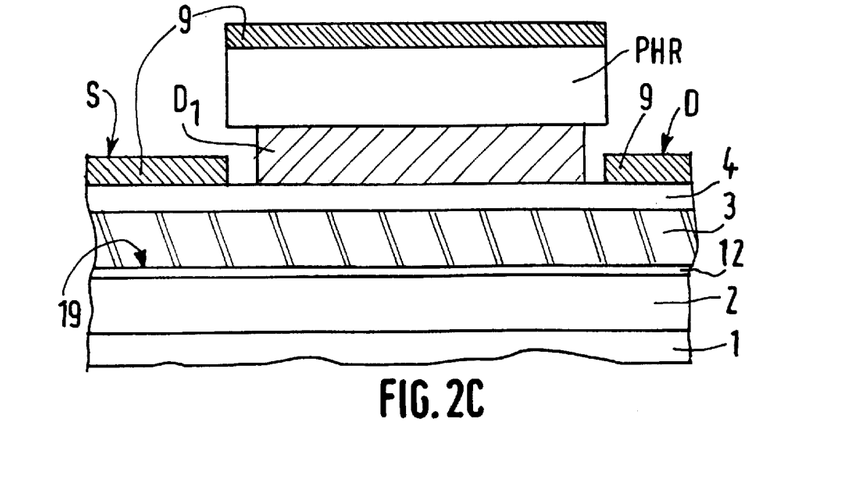
Figure 2D:
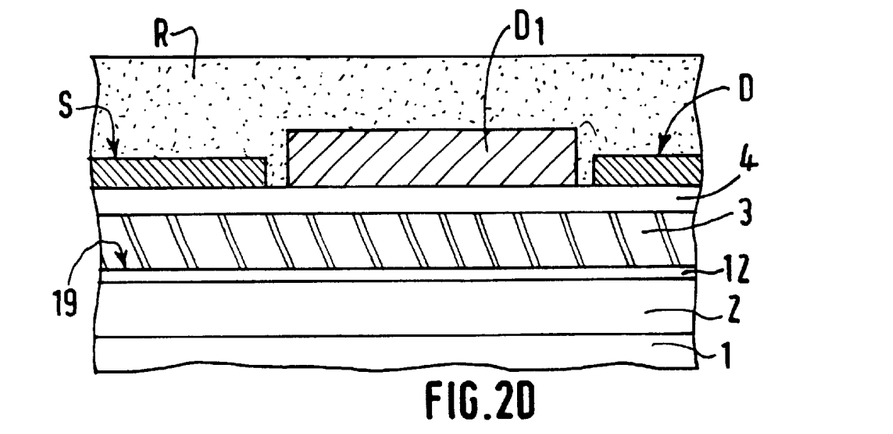
Figure 2E:
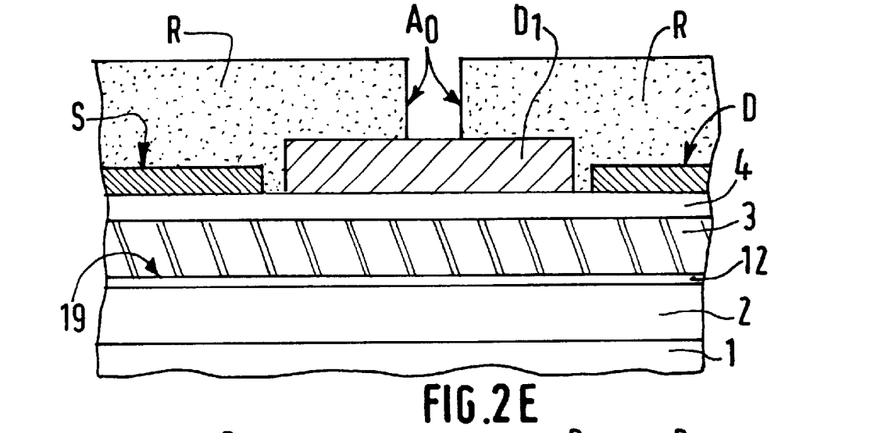
Figure 2F:
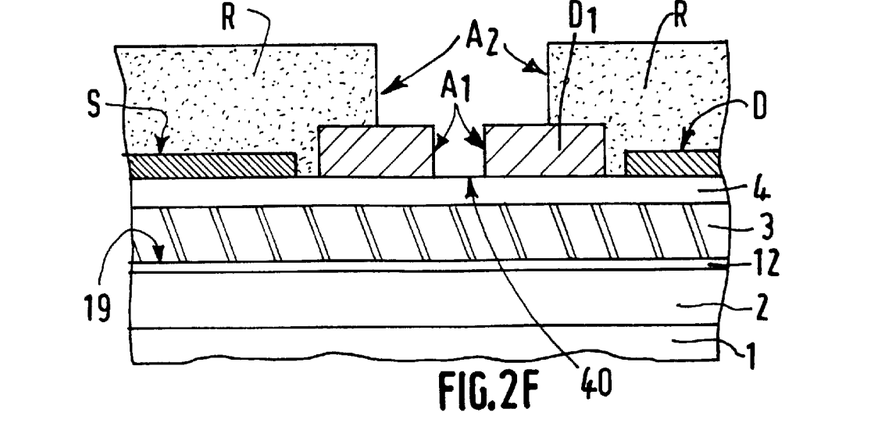
Figure 2G:
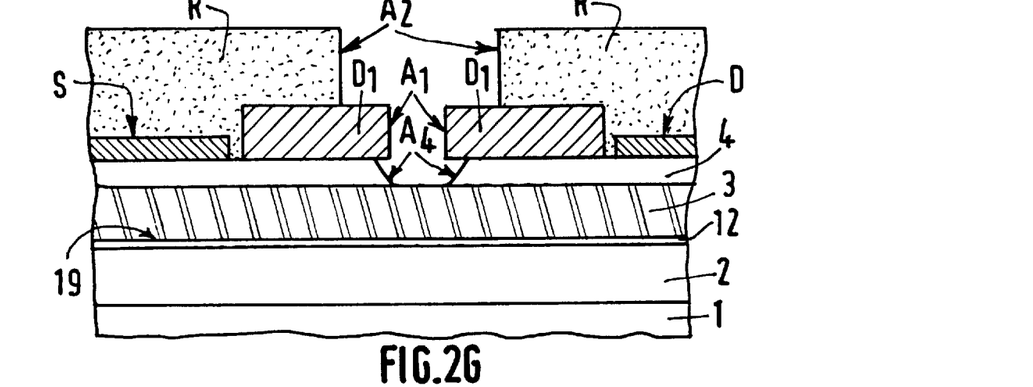
Figure 2H:
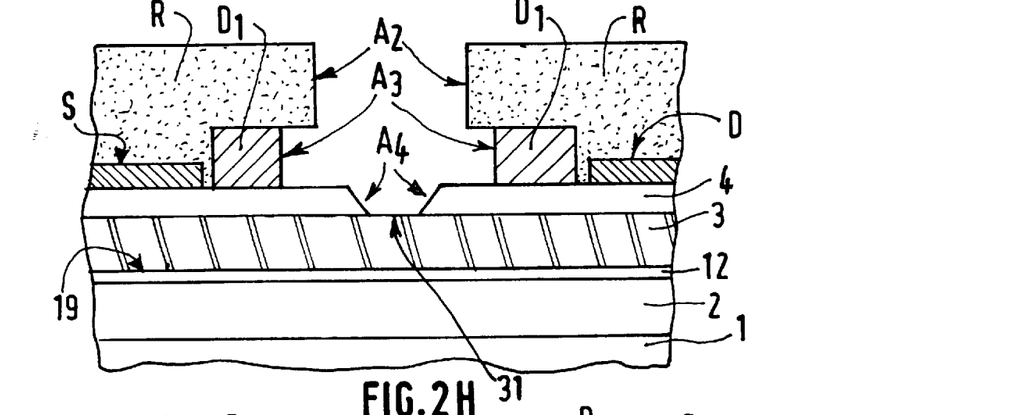
Figure 2I:
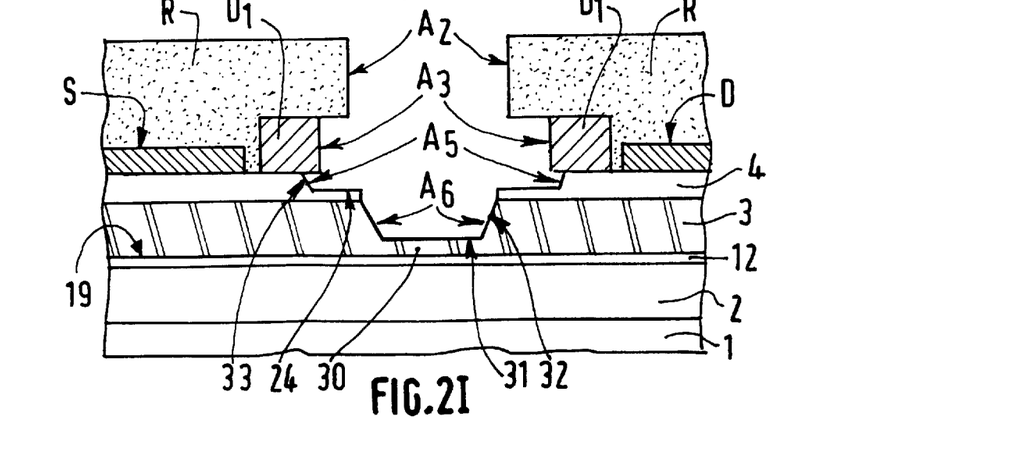
Figure 2J:
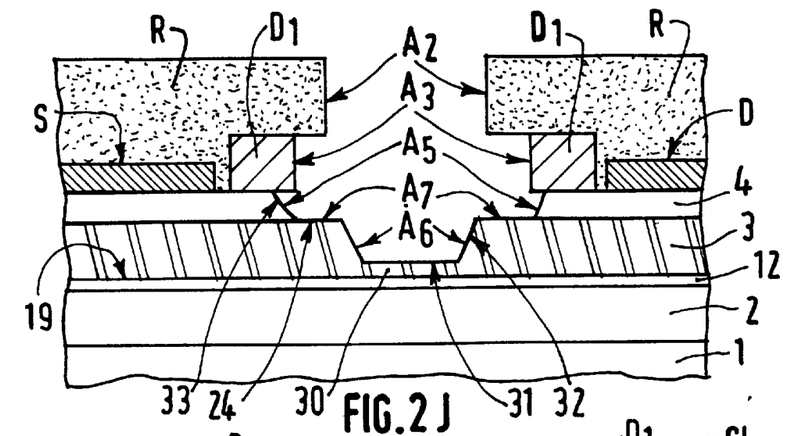
Figure 2K:
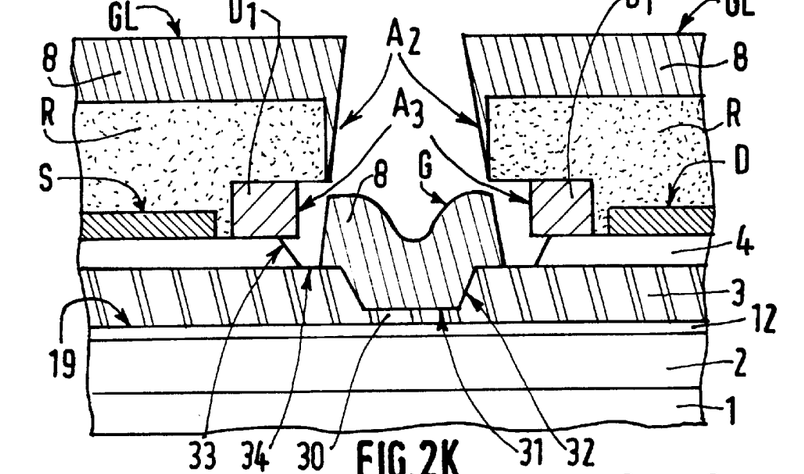
Figure 3:
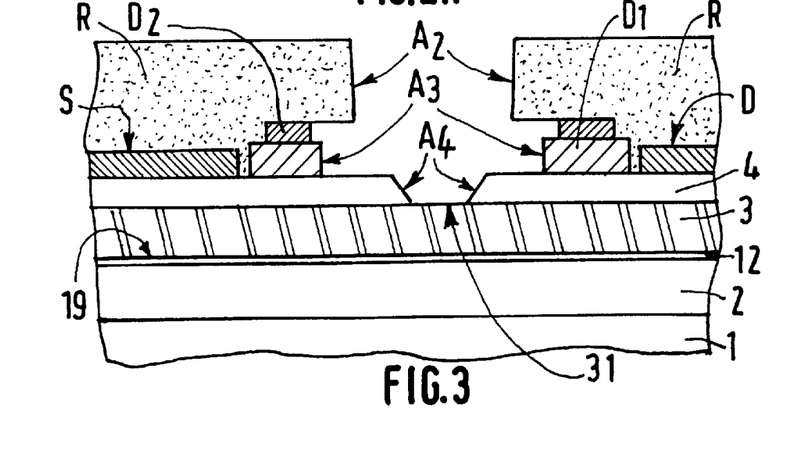
FIG. 3 illustrates a step, which is similar to the one of FIG. 2H in an advantageous variation of the process of manufacturing the field effect transistor of FIG. 1B.

An advantageous process for realizing a field effect transistor having a double-level recessed gate, and source and drain electrode contacts, as described above, may include several steps illustrated by FIGS. 2A to 2K and by FIG. 3.

a) According to FIG. 2A, in a first version of a process for forming a field effect transistor, said process may comprise the formation of a substrate 1 from semi-insulating gallium-arsenide and the formation of an active layer 3 of gallium arsenide (GaAs), referred to as Schottky layer.

In a preferred embodiment for forming a transistor HEMT, the process may comprise the formation of a substrate 1 from semi-insulating gallium arsenide, the formation of a layer 2, a so-called buffer layer, of not intentionally doped gallium arsenide having a thickness lying between 100 and 1000 nm, preferably 400 nm, and having a first forbidden bandwidth, the formation of a layer 3 of gallium-aluminum arsenide (GaAlAs), a so-called Schottky layer, with an aluminum (Al) concentration of the order of 22% and not intentionally doped in the portion corresponding to the first recess and heavily n$^{++}$ doped on either side of this portion, for example by means of silicon (Si) in a concentration higher than or equal to $10^{18} \times cm^{-2}$, said layer having a thickness ranging between 20 and 80 nm, preferably 50 nm, and having a second forbidden bandwidth which is greater than that of the subjacent layer 2, and the formation of a capping layer 4 whose semiconductor material does not comprise aluminum. The layer 3 preferably has an aluminum (Al) concentration which is not zero, for example 0.1, in the formula of the semiconductor compound, which is already sufficient for implementing the proposed process.

With reference to FIG. 2A, in a modified preferred version of a process for forming the transistor, this process may comprise the formation on the substrate 1 of the layer 2, the so-called buffer layer, of gallium arsenide (GaAs) which is not intentionally doped; the formation of a layer 12 of gallium-indium arsenide (GaInAs), a so-called channel layer, having an indium concentration of the order of 22%, which layer is not intentionally doped below the first recess, and has a thickness lying between about 0 and 30 nm, preferably 10 nm; the formation of the layer 3 of gallium-aluminum arsenide (GaAlAs), the so-called Schottky layer having an aluminum (Al) concentration of the order of 22%, which layer is not intentionally doped and has a thickness of 10 to 40 nm, preferably 25 nm, and the formation of the capping layer 4 of gallium arsenide (GaAs), which is heavily n$^{++}$ doped with a concentration higher than $10^{18} \times cm^{-3}$ and has a thickness lying between 5 and 20 nm, preferably 50 nm.

The gallium-indium arsenide (GaInAs) channel layer 12 has given forbidden bandwidth, while the Schottky layer 3 of gallium-aluminum arsenide (GaAlAs) has a greater forbidden bandwidth. The HEMT according to this arrangement is called pseudomorphic and has an improved performance because the difference between the forbidden bandwidths of the materials is greater. A two-dimensional electron gas develops in a HEMT at the interface 19 of the layers of different forbidden bandwidths.

The stack of layers of semiconductor materials is completed for example by means of epitaxial growth, for which favorably a technique known to those skilled in the art is used such as molecular beam eptiaxy or organo-metallic vapor phase deposition.

With reference to FIG. 2A, for carrying out the steps necessary to form the electrodes, a first continuous dielectric layer $D_1$ is formed on this stack of layers. This first dielectric layer may be a mono-layer $D_1$ of $SiO_2$, or a continuous multi-layer $D_1$–$D_2$ of $SiO_2$ and $Si_3N_4$ respectively, disposed as shown in the resulting transistor of FIG. 1B or in FIG. 3.

Advantageously, in the next steps the ohmic contacts of source and drain S and D are formed. These steps comprise, also with reference to FIG. 2A, the formation of a photo-resist layer, denoted by PHR, above the first dielectric layer $D_1$ or $D_1$–$D_2$ and the formation of apertures $A_{S0}$ and $A_{D0}$ in the photo-resist PHR by a standard photolithographic process. These apertures $A_{S0}$ and $A_{D0}$ are suitable for defining the source and drain electrodes S and D.

b) With reference to FIG. 2B, the formation of apertures $A_S$ and $A_D$ using a RIE method, for example including gases such as $SF_6$ mixed with $CHF_3$, for etching the dielectric layer $D_1$ or $D_1$–$D_2$ through $AS_0$ and $AD_0$, said dielectric layer being under-etched with respect to the photo-resist layer PHR.

c) With reference to FIG. 2C, the deposition of a metal layer 9 for forming ohmic contacts S and D in the apertures $A_S$ and $A_D$ on the upper surface of the subjacent semiconductor layer. The metal layer 9 deposited in regions other than these apertures $AS_0$ and $AD_0$ is removed for instance by a lift-off method eliminating the photoresist PHR, so that the first dielectric layer $D_1$ or $D_1$–$D_2$ deposited in step b) shown in FIG. 2A may be exposed amd used in the further steps for forming the gate double-level recess.

The importance of forming source and drain contacts before carrying out further steps resides in that the etching depth of the central recess for forming the channel may be monitored very simply by controlling the drain-source current during etching. Using this method, it has been found that the steps of etching the central recess are completed when the right current is reached, which means that the right thickness of layer 30 is obtained.

Next, the process for realizing the double level recess for the gate is carried out, comprising the subsequent steps described hereafter.

d) With reference to FIG. 2D, the formation of a second dielectric layer having etching properties different from those of the first dielectric layer. This second dielectric layer is preferably a photosensitive resin, for example a classical photo-resist, so-called resist R, covering the upper surface of the system provided in step c).

e) With reference to FIG. 2E, the formation of an aperture $A_0$ having a first transverse dimension referred to as first width, in the second dielectric layer, i.e. the resist layer R, by a standard photolithographic method.

f) With reference to FIG. 2F, the formation, in the first dielectric layer $D_1$ or $D_1$–$D_2$, of an opening $A_1$, termed first opening $A_1$, having the same first transverse dimension as the aperture $A_0$, by etching through said opening $A_0$. The transverse dimensions are measured parallel to the length of the gate G measured along the axis A-A' of the figures. This first opening $A_1$ is advantageously manufactured by RIE as described in step b) which enables a directional etching of the first and second dielectric layers. The transverse dimension of said first opening may be in the micron or sub-micron range, depending on said gate length of the transistor. It is to be noted that during etching the first opening $A_1$, the previous aperture $A_0$ formed in the resist R is enlarged on each side of $A_1$, the enlargement being equal to the thickness of the first dielectric layer $D_1$, resulting in an enlarged opening having a second width, termed second opening $A_2$, in the second dielectric layer i.e. the resist R; when the first dielectric layer is a multi-layer $D_1$–$D_2$, both layers are etched by RIE in this step.

g) With reference to FIG. 2G, etching of a preliminary recess $A_4$ in the upper part of the semiconductor stacked layers. In the process of HEMT manufacturing, the capping layer 4 is etched through the first opening $A_1$ of the first dielectric layer $D_1$ or $D_1$–$D_2$; this recess is formed so as to extend down to the upper surface 31 of the subjacent active layer 3 this recess may be formed using a RIE method including $SF_6$, $SiCl_4$ plasma which etches the GaAs material of the capping layer 4 and stops at the GaAlAs material of the active layer 3 as a matter of fact, by this RIE method, an aluminum fluoride ($AlF_3$) layer is spontaneously formed at the surface 31 of the active layer 3 and constitutes a stopper layer which may be further eliminated by rinsing in water; this results in the appearance of the surface 31 of the material of the subjacent active layer 3, i.e. gallium-aluminum arsenide (GaAlAs).

h) As shown in FIG. 2H, enlargement of the first opening $A_1$ previously made in the first dielectric layer $D_1$ or $D_1$–$D_2$, for forming an enlarged opening $A_3$ termed third opening $A_3$ which is larger than the second opening $A_2$ in the resist R, by back-etching the first dielectric layer with respect to the resist layer R; this back-etching of the first dielectric material may be performed using a HF buffered wet etchant including a solution of HF, $NH_4$ in water.

The opening $A_2$ of the second dielectric layer, i.e. the resist R, is suitable to delimit the deposition of the future metallization 8 for the transistor gate G ; this is the reason why the first dielectric layer $D_1$ or $D_1$–$D_2$ must be back-etched according to the third width of said third opening $A_3$ to permit the deposition of the metallic layer 8 extending also on the periphery of the central gate recess as further shown in FIG. 2K or in FIG. 1A.

When the multi-layer $D_1$–$D_2$ is used, with reference to FIG. 3, there is an advantage with respect to the use of a mono-layer $D_1$. This advantage can be attributed to the fact that the material $Si_3N_4$ used for $D_2$, which is above the material $SiO_2$ used for $D_1$, is etched at a higher rate than said material of $D_1$. Thus, said material of $D_2$ is etched back further than the material of $D_1$ with respect to the resist R. This results in the third opening $A_3$ being larger in its upper part, forming a two-level opening $A_3$ which is favorable to deposit the metallization 8 of the gate electrode G extending over the periphery 34 of the central recess 31, 32. This is still visible in FIG. 1B.

i) With reference to FIG. 2I, a non-selective etching step is carried out on the semiconductor layers 4, 3 so as to form the deeper and narrower central recess $A_6$ having a bottom 31 and walls 32 of the channel and the shallower and larger peripheral recess $A_5$ of the channel in a single step; the channel having a double-level recess is accordingly formed simultaneously in this step; the preliminary recess $A_4$ previously realized as shown in FIG. 2H serves as a mask for etching the central recess $A_6$ ; during this etching process, the active layer 3 of GaAlAs is etched to the dimensions of the preliminary recess $A_4$, yet with a slight increase of its proportions known to those skilled in the art, which leads to the formation of the central recess $A_6$ ; etching is stopped at a depth where the electrical characteristics which are a function of the remaining thickness 30 of the active layer 3 have been achieved, which can be electrically tested on the transistor during the etching process thanks to the already present source and drain contacts. The third opening $A_3$ in the first dielectric layer, previously made as shown in FIG. 2H, serves as a mask for realizing the peripheral recess having walls 33 ; during this simultaneous etching, the capping layer 4 of GaAs is etched to the dimension of this third opening $A_3$, i.e. slightly larger than said third opening $A_3$ due to under-etching. This etching may take place in a wet process by means of a mixture of $NH_4OH$, with $H_2O_2$ and $H_2O$. The advantage is that the etched surfaces obtained are clean and not attacked by the etching process. The capping layer 4 may be etched across a part of its thickness, or across its thickness such that, in the latter case, the bottom of the peripheral recess is the upper surface 34 of the active layer 3 of GaAlAs.

j) With reference to FIG. 2J, the bottom of the peripheral recess is not present in the capping layer 4 as is 24 in FIG. 2I, but preferably coincides with the upper surface 34 of the upper active layer 3. In order to move the layer 4 from level 24 to level 34, an etching step is carried out, for example, by reactive ion etching RIE with a plasma formed by a composite agent comprising for example a mixture of $SiCl_4$ and $SF_6$. In the example described, etching the material of the capping layer 4 of gallium arsenide (GaAs) is selective with respect to the material of the subjacent layer 3 of gallium-aluminum arsenide (GaAlAs) under these conditions. Etching stops automatically at the level of the upper surface 30 of the subjacent active layer 3 on a layer of aluminum fluoride ($AlF_3$) which is formed spontaneously in a thickness of one or two atomic mono-layers and which is removed by rinsing in water.

Subsequently, also with reference to FIG. 2J, a wet process in accordance with the one carried out in FIG. 2I is performed to obtain a good surface and to adjust the threshold voltage. Those skilled in the art know how to carry out such an etching step with the required accuracy of maximally a few mono-layers of semiconductor material. The etching rate is a function of the concentration of the etching agent which is known with a high accuracy ; the etching depth is a function of the etching rate and the etching time.

k) With reference to FIG. 2K, the process comprises a step in which a metal layer 8 is deposited so as to be in contact with the bottom 31 of the central recess and extend over the walls 32 of the central recess, as well as over the bottom 34 of the peripheral recess 33, 34, which step is carried out through the second opening $A_2$ of the second dielectric layer, i.e. the resist R for realizing the gate electrode G with the accuracy of this second opening $A_2$; this deposition is also carried out on the resist layer R ; this resist layer R is subsequently eliminated by a known lift-off method, which also removes the unwanted portion GL of the metal layer 8.

Figure 1C:
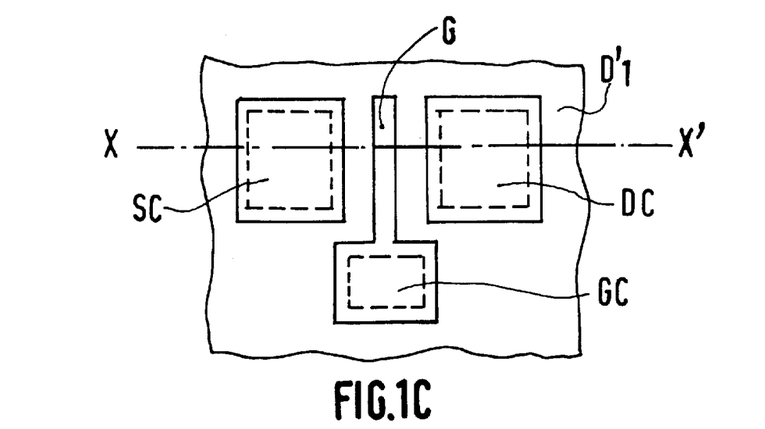
FIG. 1C shows a top view of these field effect transistors.

With reference to FIG. 1C, the upper surface of the semiconductor device including the transistor is covered with a protective dielectric layer D'$_1$. However, contact pads SC, DC and GC are exposed through said protective layer corresponding to the source S, drain D and gate G.

What is claimed is:

1. A process of manufacturing a a field effect transistor having a double-recessed gate with a central recess (A$_6$) at a relatively deep level and a peripheral recess (A$_5$) at a relatively shallow level, and a gate electrode (G) deposited so as to cover the entire central recess and extend continuously over a portion of the peripheral recess, said process comprising, for realizing said field effect transistor, the following steps:

a) forming a stack of layers comprising, on a substrate (1), an active layer (3) of semiconductor material and a first dielectric layer (D$_1$), b) covering the first dielectric layer (D$_1$) with a second dielectric layer (R) having different etching properties, forming an aperture (A$_0$) in the second dielectric layer (R) having a first width, then forming a first opening (A$_1$) in the first dielectric layer (D$_1$) having a same first width, while enlarging said aperture (A$_0$) in the second dielectric layer ( R) to form a second opening (A$_2$) having a second width, and then etching a preliminary recess (A$_4$) in the subjacent layer of semiconductor material delimited by said first opening (A$_1$) having said first width, c) enlarging said first opening (A$_1$) in the first dielectric layer (D$_1$) to form a third opening (A$_3$) having a third width larger than the second width of the second opening (A$_2$) of the second dielectric layer (R), and then etching the semiconductor layer through said preliminary recess (A$_4$) to form relatively deep central recess (A$_6$) having substantially said first width while etching said relatively shallow peripheral recess (A$_5$) having substantially said third width of said third opening (A$_3$) of the first dielectric layer (D$_1$), d) depositing a gate metal material (8) onto said relatively deep central recess (A$_6$), said material (8) extending over said peripheral recess substantially according to said second width of said second opening (A$_2$) of said second dielectric layer (R).

2. A method as claimed in claim 1, wherein a capping layer (4) layer of semiconductor material is disposed on the surface of the active layer (3).

3. A method as claimed in claim 2, wherein the relatively deep central recess (A6) is formed in the active layer and the relatively shallow peripheral recess (A$_5$) is formed in the capping layer.

4. A method as claimed in claim 1, wherein the portion of the active layer (3) lying below the relatively deep central recess (A$_6$) is not doped.

5. A method as claimed in claim 1, wherein the source and drain contacts of the transistor are formed before the gate electrode and the etching steps for forming the double-recessed gate are controlled by controlling a drain-source current value.

6. A method as claimed in claim 5, wherein the drain-source current is controlled so as to obtain a thickness between the bottom of the central recess and the bottom of the active layer, which corresponds either to a depletion-mode transistor or to an enhancement-mode transistor.

7. A method as claimed in claim 1, wherein the first dielectric layer is formed of two superimposed layers (D$_1$–D$_2$) having different etching properties.

8. A method as claimed in claim 1, wherein the first and second openings (A$_1$, A$_2$) and the preliminary recess (A$_4$) are formed by reactive ion etching, and the enlarged opening (A$_3$) and the double-level recess (A$_5$, A$_6$) are formed using a wet-etching technique.

9. A method as claimed in claim 1, wherein the stack of layers comprises an active layer of III–V compounds and aluminum, a capping layer of compounds of III–V materials without aluminum, wherein the first dielectric material is formed of silicon oxide and/or silicon nitride and the second dielectric material is formed of a resist, and wherein the reactive ion etching step in the semiconductor materials is carried out using a plasma including fluoride for forming a spontaneous stop-layer as soon as the active layer of III–V compounds and aluminum is reached.

10. A method as claimed in claim 1 wherein the field effect transistor is a high electron mobility transistor and the active layer comprises a heterojunction.

* * * * *